United States Patent
Wang

(10) Patent No.: US 11,355,732 B2
(45) Date of Patent: Jun. 7, 2022

(54) DISPLAY DEVICE AND MANUFACTURING METHOD THEREOF

(71) Applicant: WUHAN CHINA STAR OPTOELECTRONICS SEMICONDUCTOR DISPLAY TECHNOLOGY CO., LTD., Wuhan (CN)

(72) Inventor: Jing Wang, Wuhan (CN)

( * ) Notice: Subject to any disclaimer, the term of this patent is extended or adjusted under 35 U.S.C. 154(b) by 197 days.

(21) Appl. No.: 16/652,691

(22) PCT Filed: Mar. 24, 2020

(86) PCT No.: PCT/CN2020/080911
§ 371 (c)(1),
(2) Date: Apr. 1, 2020

(87) PCT Pub. No.: WO2021/155629
PCT Pub. Date: Aug. 12, 2021

(65) Prior Publication Data
US 2021/0408465 A1    Dec. 30, 2021

(30) Foreign Application Priority Data
Feb. 7, 2020    (CN) .......................... 202010082962.1

(51) Int. Cl.
*H01L 51/52*    (2006.01)
*H01L 51/56*    (2006.01)

(52) U.S. Cl.
CPC .......... *H01L 51/5253* (2013.01); *H01L 51/56* (2013.01); *H01L 2251/5338* (2013.01)

(58) Field of Classification Search
CPC ................. H01L 51/5253; H01L 51/56; H01L 2251/5338
See application file for complete search history.

(56) References Cited

U.S. PATENT DOCUMENTS

| | | | |
|---|---|---|---|
| 9,709,716 B2 * | 7/2017 | Oh | ..................... G02F 1/133514 |
| 2016/0247862 A1 * | 8/2016 | Song | .................... H01L 27/3246 |
| 2017/0084869 A1 | 3/2017 | Wang et al. | |
| 2019/0341580 A1 | 11/2019 | Gu | |

FOREIGN PATENT DOCUMENTS

| | | |
|---|---|---|
| CN | 104300091 A | 1/2015 |
| CN | 105047829 A | 11/2015 |
| CN | 109427996 A | 3/2019 |
| CN | 110429197 A | 11/2019 |
| CN | 110570762 A | 12/2019 |

* cited by examiner

*Primary Examiner* — Kyoung Lee

(57) ABSTRACT

A display device and a manufacturing method thereof are provided. The display device includes an organic light-emitting device, a thin-film encapsulation layer, and a hydrophobic thin film. The thin-film encapsulation layer is covered on the organic light-emitting device. The hydrophobic thin film is covered on the thin-film encapsulation layer, wherein the hydrophobic thin film has at least one first pattern.

9 Claims, 3 Drawing Sheets

DISPLAY DEVICE AND MANUFACTURING METHOD THEREOF

CROSS-REFERENCES TO RELATED APPLICATIONS

This application is a national stage of International Application No. PCT/CN2020/080911, filed on Mar. 24, 2020, which claims priority to Chinese Patent Application No. 202010082962.1, filed on Feb. 7, 2020. Both of the aforementioned applications are hereby incorporated by reference in their entireties.

FIELD OF INVENTION

The present invention relates to the field of display devices, in particular to a display device and a method of manufacturing same.

BACKGROUND OF INVENTION

With rapid development of organic light-emitting diode (OLED) technologies and large investment in research and development, OLED has gradually started to a phase of mass production and commercial applications. OLED devices have many advantages such as solid state, can be bent, fast response times, wide viewing angles, self-luminous, ultra-thin, and weight ultra-light, etc.

However, current OLED technologies in the industry are actually not perfect. Compared with liquid crystal display (LCD) screens, OLED screens still have shortcomings such as short service life and rapid decline in luminous capacity. Among them, the important factor is that organic light-emitting polymers are easily affected by oxygen and water, and the oxidation reaction generated will rapidly reduce efficiency and lifetime of the OLED devices. Therefore, protecting OLED light-emitting layers from water and oxygen intrusion have played a vital role in extending service life of the OLED devices and improving light-emitting efficiency.

At present, sandwich encapsulation is commonly used in the industry, that is, an encapsulation structure in form of inorganic-organic-inorganic. In this structure, a surface of an inorganic layer usually has good hydrophobicity in order to ensure strong compactness to prevent water and oxygen. Moreover, for a flexible screen that can be bent, because it is repeatedly bent during use, stress in a bending region is large, and it is easy to cause film layer in the bending region to fall off, resulting in encapsulation failure and a sharp decline in service life of the flexible screen.

SUMMARY OF INVENTION

An object of the present invention is to provide a display device and a method of manufacturing same, so as to solve a problem that an encapsulation layer in a flexible organic light-emitting diode (OLED) display device in a conventional art is easy to fall off during repeated bending and thus cause an encapsulation failure.

Technical Solutions

To achieve the above object, the present invention provides a display device, which includes an organic light-emitting device, a thin-film encapsulation layer, and a hydrophobic thin film. The thin-film encapsulation layer covers the organic light-emitting device. The hydrophobic thin film covers the film encapsulation layer. Meanwhile, the hydrophobic thin film includes at least one first pattern.

Furthermore, the display device further including at least two non-bending regions and a bending region connecting the at least two non-bending regions, a bending line defined on the bending region, and the bending region bending along the bending line.

The first pattern includes hollow portions and a masking portion. At least two hollow portions respectively defined on two sides of the bending region. The masking portion surrounds the at least two hollow portions. The masking portion positioning between the at least two hollow portions corresponds to the bending line.

Furthermore, the masking portion includes a plurality of grooves, the grooves interlaced with each other and penetrate the hydrophobic thin film. Each of the grooves includes at least two groove walls with an included angle between the at least two groove walls, and the included angle is less than 180°. The display device includes a bending radius R in the bending region, a penetration length of the grooves is L, and L satisfies a following formula: $L > \pi R$.

Furthermore, at least one side of the masking portion away from the at least two hollow portions includes a zigzag structure in the bending region.

The invention also provides a method of manufacturing the above display device, which includes following steps.

Preparing a mask plate. providing a base layer, wherein the base layer includes the organic light-emitting device and the thin-film encapsulation layer covering the organic light-emitting device. Forming the hydrophobic thin film on the thin-film encapsulation layer by using the mask plate and a deposition method, wherein the mask includes a second pattern.

Furthermore, the second pattern includes first shielding portions, a plurality of through-hole portions, and second shielding portion.

At least two first shielding portions corresponding to the at least two hollow portions of the hydrophobic thin film. The through-hole portions surround the at least two first shielding portions and correspond to the masking portion of the hydrophobic thin film. At least two second shielding portion surrounding the through-hole portions.

Furthermore, the second pattern further includes a plurality of third shielding portions connected to the at least two first shielding portions and the second shielding portion through the through-hole portions, and corresponding to the grooves of the hydrophobic thin film.

Furthermore, a plurality of shadow slopes of the mask plate are arranged at the second shielding portion and the third shielding portions, and are oriented toward the through-hole portions. Each of the shadow slopes is arranged on a same surface of the mask plate. A cross-sectional width of the third shielding portions is D, a horizontal width of the shadow slopes is W, wherein D and W satisfy following formula: $D \leq 2*W$.

Furthermore, the second pattern includes at least two first regions and a second region connected to the at least two first regions, the at least two first regions correspond to the non-bending region of the hydrophobic thin film, the second region corresponds to the bending region of the hydrophobic thin film, and a side of the second shielding portion facing the through-hole portions includes a zigzag structure in the second region.

Furthermore, the deposition method is at least one of a plasma chemical vapor-deposition method, a low-pressure plasma chemical vapor-deposition method, a radio frequency pulsed low-pressure plasma chemical vapor-deposition method, a microwave plasma chemical vapor-deposition method, or an atmospheric pressure plasma chemical vapor-deposition method.

Beneficial Effect

The advantage of the present invention is that a display device of the present invention enhances encapsulation effect of the display device by adding a layer of a hydrophobic thin film with a special pattern on the current display device, prevents water and oxygen from invading, and extends service life of the display device. In the meantime, the hydrophobic thin film also has grooves and a zigzag structure. When the display device is bent, the grooves and the zigzag structure can disperse bending stress generated during the bending and prevent an encapsulation layer of the display device from problems such as cracks and peeling, improving reliability of the display device and further extend service life of the display device. In addition, the present invention also provides a method of preparing the hydrophobic thin film. The method of depositing the hydrophobic thin film can directly use an equipment used in preparing a thin-film encapsulation layer, without other equipment, simplifying the manufacturing steps and saving equipment costs.

Figure 1:
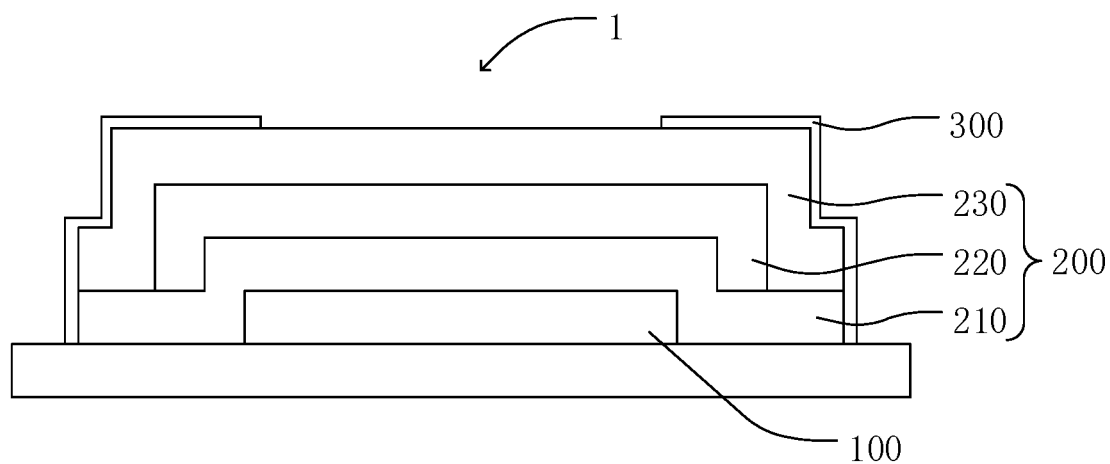
FIG. 1 is a layered schematic diagram of a display device according to a first embodiment of the present invention.

Reference number of components in the figures are as follows:
display device, 1;
organic light-emitting device, 100; thin-film encapsulation layer, 200;
first inorganic layer, 210; organic layer, 220;
second inorganic layer, 230; hydrophobic thin film, 300;
non-bending region, 301; bending region, 302; bending line, 303;
first pattern, 310; hollow portion, 311;
masking portion, 312; groove, 313; groove wall, 314;
base layer, 10; mask plate, 400;
first region, 401; second region, 402;
second pattern, 410; first shielding portion, 411;
through-hole portion, 412; second shielding portion, 413;
third shielding portion, 414; shadow slope, 415; and
protection frame, 420.

DETAILED DESCRIPTION OF EMBODIMENTS

The following describes the preferred embodiments of the present invention with reference to the accompanying drawings of the specification, and proves that the present invention can be implemented. The embodiments of the present invention can completely introduce the present invention to those skilled in the art, and make the technical content more clear and easier to understand. The present invention can be embodied by many different forms of the invention embodiments, and the protection scope of the invention is not limited to the embodiments mentioned in the text.

In the drawings, components having same structure are denoted by same numerals, and components having similar structures or functions are denoted by similar numerals. The size and thickness of each component shown in the drawings are arbitrarily shown, and the present invention does not limit the size and thickness of each component. In order to make the illustration clearer, the thickness of parts is exaggerated in some places in the drawings.

In addition, the following descriptions of each embodiment of the invention are made with reference to additional illustrations to illustrate specific invention embodiments that the invention can be implemented with. The directional terms mentioned in the present invention, for example, "up", "down", "front", "rear", "left", "right", "inside", "outside", "side", etc., the orientation or positional relationship of the indications is based on the orientation or positional relationship shown in the drawings, and is merely for the convenience of the description of the invention and the simplified description, rather than indicating or implying that the device or component referred to has a specific orientation, in a specific orientation. The construction and operation are therefore not to be construed as limiting the invention. In addition, such words as "first", "second", and "third" are merely used to differentiate different components rather than to represent any order, number or importance.

When certain components are described as being "on" another component, the component may be placed directly on the other component; there may also be an intermediate component on which the component is placed, and the intermediate component is placed on another component. When a component is described as "mounted to" or "connected to" another component, the two can be understood as directly "mounted" or "connected", or a component is "mounted to" or "connected to" another component through an intermediate component.

First Embodiment

An embodiment of the present invention provides a display device. The display device is an organic light-emitting diode (OLED) display device, it can be a laptop computer, a mobile phone, a tablet computer, a television, etc., which has a screen display functional device.

The display device includes a display device 1 as shown in FIG. 1. The display device 1 includes a substrate, an organic light-emitting device 100, a thin-film encapsulation layer 200, and a hydrophobic thin film 300.

The organic light-emitting device 100 is an organic light-emitting diode, which is disposed on the substrate. The organic light-emitting device 100 includes a layered structure such as an anode, a cathode, and a light-emitting layer. Under an action of an electric field, holes generated in the anode and electrons generated in the cathode will move and inject to a hole-transporting layer and an electron-transporting layer, respectively, and migrate to a light-emitting layer. When holes and electrons meet in the light-emitting layer, energy excitons are generated, thereby exciting light-emitting molecules to finally generate visible light, and providing a display image for the display device.

The thin-film encapsulation layer 200 is covered on the organic light-emitting device 100 and is prepared by using a thin-film encapsulation (TFE) technology. The thin-film encapsulation layer 200 has a three-layer structure, which is a first inorganic layer 210, a second inorganic layer 230, and an organic layer 220, respectively. The first inorganic layer 210 covers the organic light-emitting device 100 and the substrate, the organic layer 220 is disposed on a surface of the first inorganic layer 210 away from the organic light-emitting device 100, and the second inorganic layers 230 covers the organic layer 220 disposing on the first inorganic layer 210. The first inorganic layer 210 and the second inorganic layer 230 include at least one of inorganic materials such as silicon oxide, silicon nitride, or silicon oxynitride. The organic layer 220 includes at least one of polymethyl methacrylate, epoxy resin, acrylic organic material, or atomic monomer material. The thin-film encapsulation layer 200 is used to protect the organic light-emitting device 100 from water and oxygen, preventing water and oxygen from attacking the organic light-emitting device 100, and prolonging service life of the display device.

The hydrophobic thin film 300 is covered on the thin-film encapsulation layer 200. The hydrophobic thin film 300 is used to further protect the display device 1 and prevent the thin-film encapsulation layer 200 from penetrating, cracking, and falling off during bending. The hydrophobic thin film 300 can have at least one of inorganic materials such as carbon nanotubes, zinc oxide nanorods, or silicon oxide, or can further include at least one of trimethylmethoxysilane, octamethylcyclotetrasiloxane, or tetrafluoroethane, tetramethylsilane, or organic monomer materials such as 1H, 1H, 2H, 2H-perfluorodecyltriethoxysilane.

Figure 2:
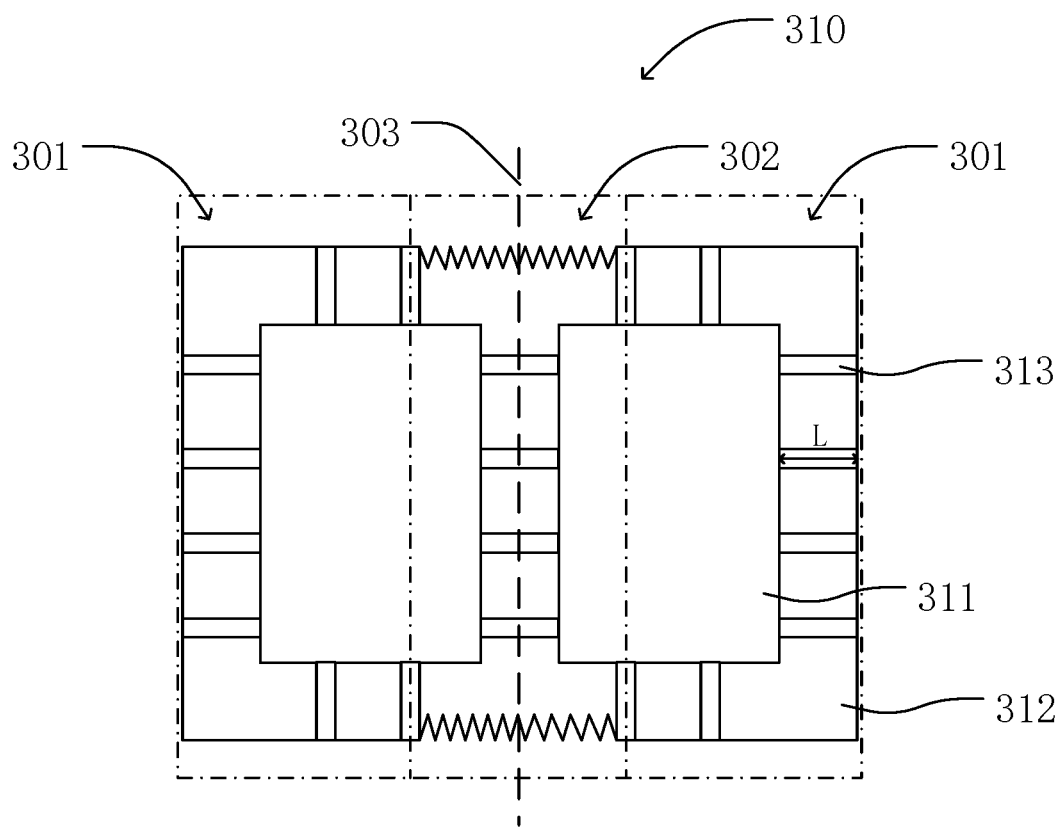
FIG. 2 is a top plane view of the display device according to the first embodiment of the present invention.

As shown in FIG. 2, which the display device 1 includes a bending region 302 and two non-bending regions 301. The bending region 302 is positioned between the two non-bending regions 301 and connects the two non-bending regions 301. A bending line 303 is defined in the bending region 302, and the bending region 302 of the display device is bent along the bending line 303.

The hydrophobic thin film 300 includes a first pattern 310. The first pattern 310 includes two hollow portions 311 and a masking portion 312. The hollow portions 311 correspond to two sides of the bending region 302. The masking portion 312 covers a surface of the thin-film encapsulation layer 200 perpendicular to the organic light-emitting device 100, and extends to a surface of the thin-film encapsulation layer 200 away from the organic light-emitting device 100. The masking portion 312 surrounds each hollowed-out region. The masking portion 312 positioned between the two hollow portions 311 corresponds to the bending region 302 and corresponds to the bending line 303. In the bending region 302, both sides of the masking portion 312 of the hydrophobic thin film 300 away from the hollow portions 311 have a zigzag structure.

Figure 3:
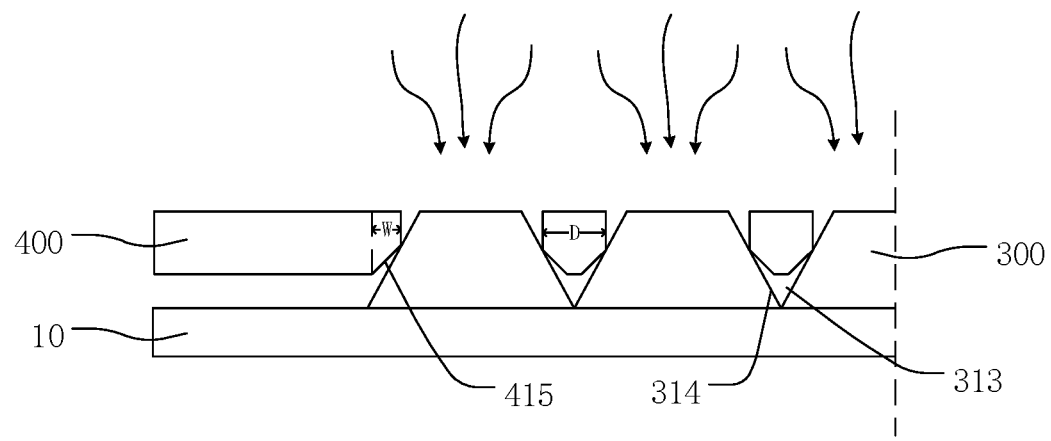
FIG. 3 is a layered schematic diagram of a mask plate and the display device according to the first embodiment of the present invention.

The hydrophobic thin film 300 further includes a plurality of grooves 313. The grooves 313 face away from the organic light-emitting device 100 and penetrate the masking portion 312 of the hydrophobic thin film 300. As shown in FIG. 3, which each of the grooves 313 has two groove walls 314 with an included angle between the two groove walls 314, and the included angle is less than 180°. Each of the grooves 313 includes lateral grooves 313 and longitudinal grooves 313. An extension line of the lateral grooves 313 is perpendicular to an extension line of the longitudinal grooves 313. The penetration lengths of the lateral grooves 313 and the longitudinal grooves 313 313 are all same. The lateral grooves 313 and the longitudinal grooves 313 are respectively arranged in an array on the masking portion 312.

Figure 4:
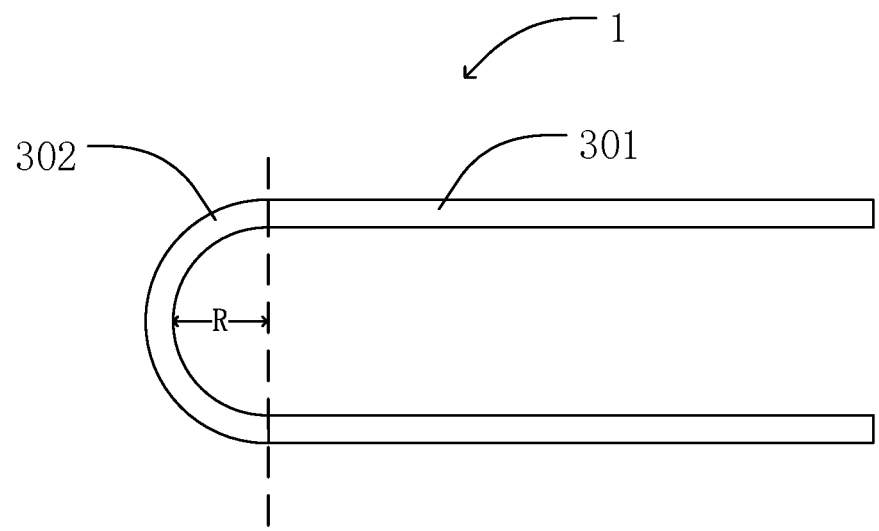
FIG. 4 is a schematic bending diagram of the display device according to the first embodiment of the present invention.

As shown in FIG. 4, when the display device 1 is bent, the bending region 302 has a bending radius, and the bending radius is R, and a penetration length of the grooves 313 is L, and L satisfies a following formula:

$$L > \pi R.$$

The display device 1 according to an embodiment of the present invention is provided by adding a layer of the hydrophobic thin film 300 having a special pattern on the current display device 1 to enhance encapsulation effect of the display device 1, prevents water and oxygen from invading, and extends service life of the display device. In the meantime, the hydrophobic thin film also has the grooves 313 and the zigzag structure. When the display device 1 is bent, the grooves 313 and the zigzag structure can disperse bending stress generated during the bending, and prevent an encapsulation layer of the display device 1 from problems such as cracks and peeling, improving reliability of the display device 1, further extending service life of the display device, and improving user experience.

An embodiment of the present invention further provides a method of manufacturing the display device 1, which includes following steps.

Figure 5:
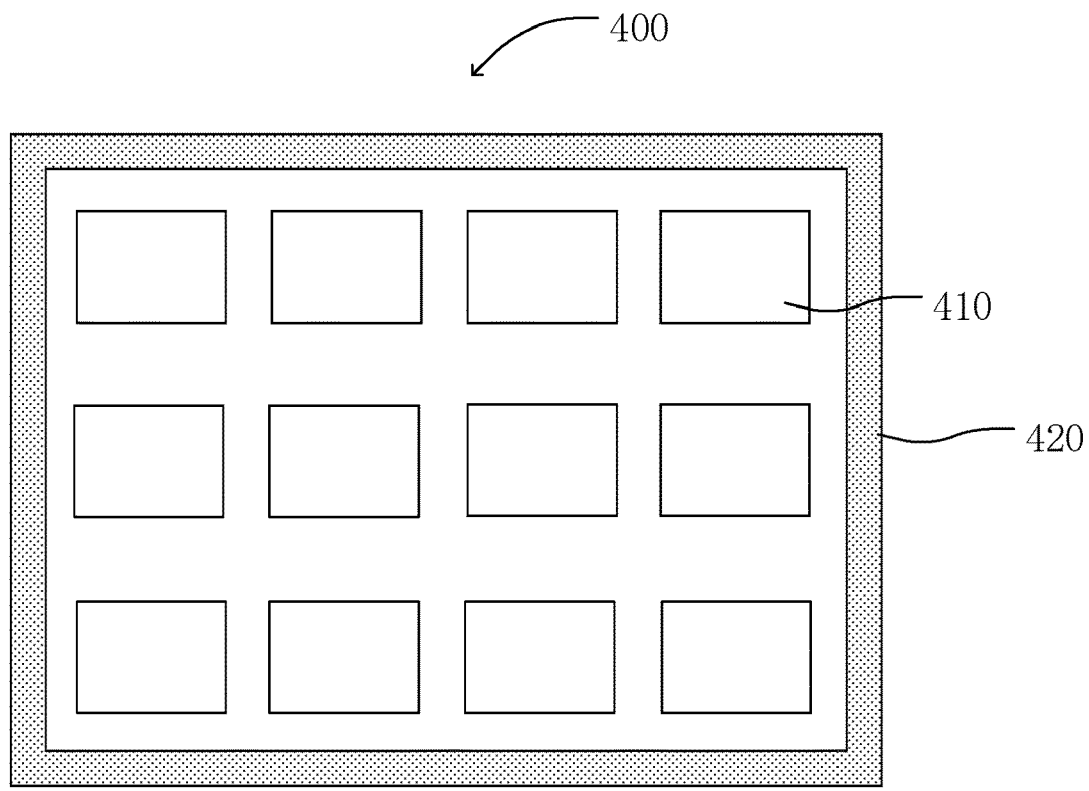
FIG. 5 is a top plane view of the mask plate according to the first embodiment of the present invention.

Step 10, preparing a mask plate 400, wherein the mask plate 400 is usually made of a metal material. First, a plurality of second patterns 410 are formed on a metal plate by electroforming, cleaning, laser cutting, electroforming, and secondary cleaning. As shown in FIG. 5, which the second patterns 410 are arranged on the metal plate in an array. Then, after chemical etching and polishing, the mask plate 400 is fixed in a protection frame 420 by welding, fusion welding or other processes. The protection frame 420 is a steel plate, which can be formed by cast, washed, laser cut, electroforming, secondary cleaning, lathe processing, and other methods. Finally, a layer of alumina is covered on a surface of the mask plate 400 to prevent the mask plate 400 from damaged by oxidative corrosion of water vapor, thereby completing the preparing of the mask plate 400.

Figure 6:
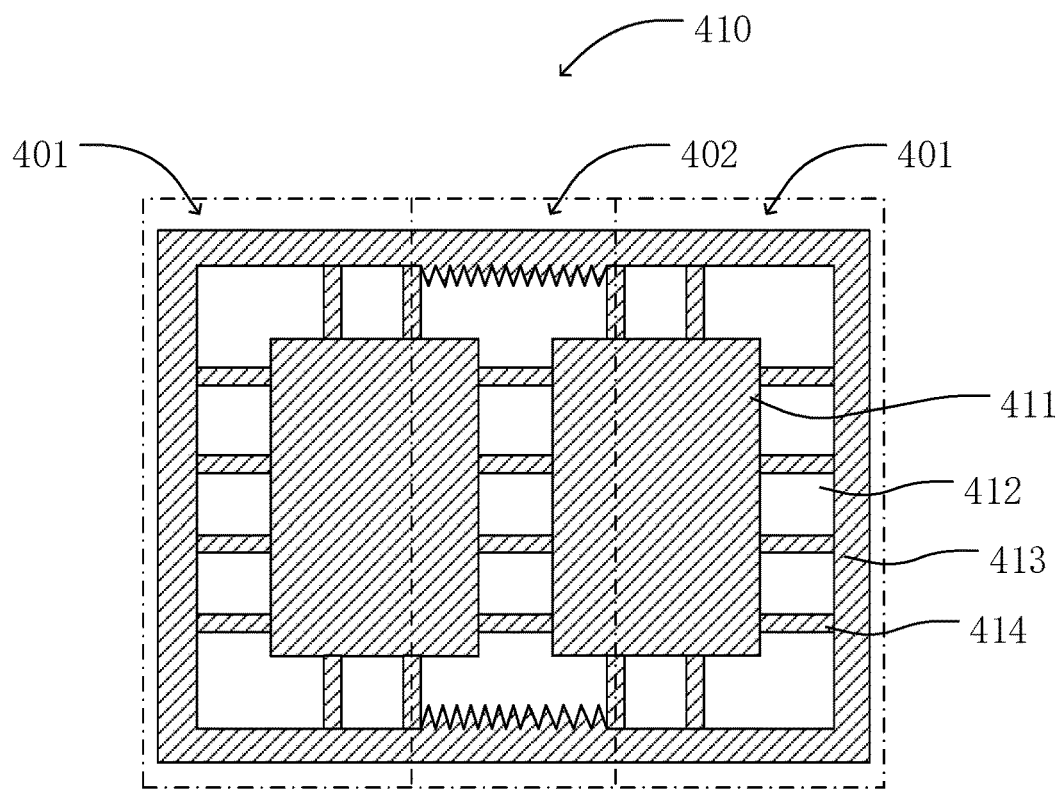
FIG. 6 is a schematic structural diagram of a second pattern according to the first embodiment of the present invention.

As shown in FIG. 6, the second patterns 410 on the mask plate 400 have at least two first regions 401 corresponding to the non-bending region 301 of the hydrophobic thin film 300 and a second region 402 corresponding to the bending region 302 of the hydrophobic thin film 300. The second region 402 is disposed between the two first regions 401 and connects the two first regions 401.

The second pattern 410 of the mask plate 400 includes two first shielding portions 411, a plurality of through-hole portions 412, and a second shielding portion 413. The two first shielding portions 411 are respectively disposed on two sides of the second region 402 and correspond to the hollow portions 311 of the hydrophobic thin film 300. The first shielding portions 411 are used to block a deposition of a material of the hydrophobic thin film 300, so as to form the hollow portions 311 of the hydrophobic thin film 300. The through-hole portions 412 surround the first shielding portions 411 and correspond to the masking portion 312 of the hydrophobic thin film 300. In the second region 402, a side of the second shielding portion 413 facing the through-hole portions has a zigzag structure. The through-hole portions 412 are used to form a specific shape of a material on a base layer 10, so as to form the masking portion 312 of the hydrophobic thin film 300. The second shielding portion 413 surrounds the through-hole portions 412 and is also used to block the deposition of the material of the hydrophobic thin film 300, and limits a size of the hydrophobic thin film 300.

The second pattern 410 further includes a plurality of third shielding portions. The third shielding portions are disposed in the through-hole portions 412 and connected to the first shielding portions 411 and the second shielding portion 413 through the through-hole portions 412. The third shielding portions correspond to the grooves 313 of the hydrophobic thin film 300.

As shown in FIG. 3, which the mask plate 400 further includes a plurality of shadow slopes 415. The shadow slopes 415 are disposed on the second shielding portion 413 and the third shielding portions 414, and each of the shadow slopes 415 faces the through-hole portions 412 and is positioned on a surface of the mask plate 400 near the hydrophobic thin film 300. Therefore, the third shielding portions 414 has two shadow slopes 415, so that a cross-section of the third shielding portions 414 is a symmetrical hexagon. Meanwhile, a cross-sectional width of the third shielding portions 414 is D, and a horizontal width of the shadow slopes 415 is W, wherein D and W satisfy following formula: $D \leq 2*W$. The third shielding portions 414 is used to block the deposition of the material of the hydrophobic thin film 300, so as to form the grooves 313 penetrating the masking portion 312 and are arranged in a direction parallel to the hydrophobic thin film 300. The shadow slopes 415 are used to extend a deposited material in a direction of the slope, so that bottoms of the grooves 313 are connected, and the two groove walls 314 opposite to the grooves 313 form the included angle 180°.

Step 20, providing a base layer 10, wherein the base layer 10 includes an organic light-emitting device 100 and a thin-film encapsulation layer 200 covering the organic light-emitting device 100. The thin-film encapsulation layer 200 can be deposited and formed by a plasma enhanced chemical vapor-deposition equipment.

Step 30, depositing a hydrophobic thin film 300, placing the base layer 10 provided in the step 20 in a chamber of an inverse plasma enhanced chemical vapor-deposition equipment for depositing the thin-film encapsulation layer 200. The mask plate 400 prepared in the step 10 is fixed above the base layer 10, and the mask plate 400 is one to two millimeters away from the base layer 10. The mask plate 400 is accurately aligned with the base layer 10, and alignment accuracy is less than or equal to 10 microns, so that each second pattern 410 on the mask plate 400 corresponds to a display device 1, respectively. The hydrophobic thin film 300 is then formed by a plasma chemical vapor-deposition method.

The plasma chemical vapor-deposition method specifically includes following steps. First, in a chamber of a plasma enhanced chemical vapor-deposition equipment, hydrogen is used as an operation gas and methane is used as a reaction gas. Then, turn on cooling water and a system power, and draw a pressure in a reaction chamber below 10 Pa while controlling flow ratio of hydrogen to methane. Next, turn on a heating system to start heating, turn on a radio frequency (RF) power source, adjust a power and a deposition pressure in a vacuum chamber to illuminate the reaction gas, and begin to grow carbon nanotubes on a surface of the thin-film encapsulation layer 200 away from the organic light-emitting device 100. After 5-30 minutes, growth of the carbon nanotubes is completed, and the hydrophobic thin film 300 is formed.

Alternatively, the plasma chemical vapor-deposition method can further specifically include following steps. First, the reaction is performed using octamethylcyclotetrasiloxane as a reaction monomer and oxygen as an operation gas. Then, a surface of the reaction monomer was hydrophilized by using an oxygen plasma treatment. Finally, the hydrophobic thin film 300 is formed on a surface of the thin-film-encapsulated inorganic layer away from the organic light-emitting device 100 by using hexamethyldisilane and hydrogen.

The method of preparing the hydrophobic thin film 300 provided in the embodiments of the present invention improves disadvantages of the hydrophobic thin film 300 prepared by spray coating and other methods in the conventional art, such as uneven thickness, uneven brightness, and poor compactness of the display device 1, and etc. Thus, the hydrophobic thin film 300 having uniform thickness, excellent sealing performance, and good surface bonding performance is obtained. In addition, during deposition of the hydrophobic thin film 300, the equipment used in preparing the thin-film encapsulation layer 200 can be directly used without other equipment, simplifying manufacturing steps and saving equipment costs.

Second Embodiment

An embodiment of the present invention provides another method of manufacturing a display device 1, which is used to prepare the display device 1 as described in the first embodiment, and includes following steps.

Step 10, preparing a mask plate 400, wherein the mask plate 400 is usually made of a metal material. First, a plurality of second patterns 410 are formed on a metal plate by methods such as electroforming, cleaning, laser cutting, electroforming, and secondary cleaning, and the second patterns 410 are arranged on the metal plate in an array. Each the second pattern 410 is similar to the second pattern 410 of the mask plate 400 in the first embodiment, so it is not described in detail here. Then, after chemical etching and polishing, the mask plate 400 is fixed in a protection frame 420 by welding, fusion welding, and other processes. The protection frame 420 is a steel plate, which can be formed by cast, washed, laser cut, electroforming, secondary cleaning, lathe processing, and other methods. Finally, a layer of alumina is covered on a surface of the mask plate 400 to prevent the mask plate 400 from damaged by oxidative corrosion of water vapor, thereby completing the preparing of the mask plate 400.

Step 20, providing a base layer 10, wherein the base layer 10 includes an organic light-emitting device 100 and a thin-film encapsulation layer 200 covering the organic light-emitting device 100. The thin-film encapsulation layer 200 can be deposited and formed by a plasma enhanced chemical vapor-deposition equipment.

Step 30, depositing a hydrophobic thin film 300, placing the base layer 10 provided in the step 20 in a chamber of a plasma enhanced chemical vapor-deposition equipment for depositing the thin-film encapsulation layer 200. The mask plate 400 prepared in the step 10 is fixed above the base layer 10, and the mask plate 400 is one to two millimeters away from the base layer 10. The mask plate 400 is accurately aligned with the base layer 10, and alignment accuracy is less than or equal to 10 microns, so that each second pattern 410 on the mask plate 400 corresponds to a display device 1, respectively. The hydrophobic thin film 300 is then formed by a low-pressure plasma chemical vapor-deposition method.

The low-pressure plasma chemical vapor-deposition method specifically includes following steps. First, using tetramethylsilane and 1H, 1H, 2H, 2H-perfluorodecyltriethoxysilane as precursor monomers, using argon as an operation gas and microwave high voltage power source as an excitation source, and under protection of argon, the precursor monomers are broken down to generate a uniform low-temperature plasma. After a vacuum-like chamber generates a chemical reaction, the hydrophobic thin film 300 having a uniform thickness is formed on a surface of the thin-film-encapsulated inorganic layer away from the organic light-emitting device 100.

The method of preparing the hydrophobic thin film 300 provided in the embodiments of the present invention improves disadvantages of the hydrophobic thin film 300 prepared by spray coating and other methods in the conventional art, such as uneven thickness, uneven brightness, and poor compactness of the display device 1, and etc. Thus, the hydrophobic thin film 300 having uniform thickness, excellent sealing performance, and good surface bonding performance is obtained. In addition, during deposition of the hydrophobic thin film 300, the equipment used in preparing the thin-film encapsulation layer 200 can be directly used without other equipment, simplifying manufacturing steps and saving equipment costs.

Third Embodiment

An embodiment of the present invention provides another method of manufacturing a display device 1, which is used to prepare the display device 1 as described in the first embodiment, and includes following steps.

Step 10, preparing a mask plate 400, wherein the mask plate 400 is usually made of a metal material. First, a plurality of second patterns 410 are formed on a metal plate by methods such as electroforming, cleaning, laser cutting, electroforming, and secondary cleaning, and the second patterns 410 are arranged on the metal plate in an array. Each the second pattern 410 is similar to the second pattern 410 of the mask plate 400 in the first embodiment, so it is not described in detail here. Then, after chemical etching and polishing, the mask plate 400 is fixed in a protection frame 420 by welding, fusion welding, and other processes. The protection frame 420 is a steel plate, which can be formed by cast, washed, laser cut, electroforming, secondary cleaning, lathe processing, and other methods. Finally, a layer of alumina is covered on a surface of the mask plate 400 to prevent the mask plate 400 from damaged by oxidative corrosion of water vapor, thereby completing the preparing of the mask plate 400.

Step 20, providing a base layer 10, wherein the base layer 10 includes an organic light-emitting device 100 and a thin-film encapsulation layer 200 covering the organic light-emitting device 100. The thin-film encapsulation layer 200 can be deposited and formed by a plasma enhanced chemical vapor-deposition equipment.

Step 30, depositing a hydrophobic thin film 300, placing the base layer 10 provided in the step 20 in a chamber of a plasma enhanced chemical vapor-deposition equipment for depositing the thin-film encapsulation layer 200. The mask plate 400 prepared in the step 10 is fixed above the base layer 10, and the mask plate 400 is one to two millimeters away from the base layer 10. The mask plate 400 is accurately aligned with the base layer 10, and alignment accuracy is less than or equal to 10 microns, so that each second pattern 410 on the mask plate 400 corresponds to a display device 1, respectively. The hydrophobic thin film 300 is then formed by a radio frequency pulsed low-pressure plasma chemical vapor-deposition method.

The radio frequency pulsed low-pressure plasma chemical vapor-deposition method specifically includes following steps. First, in the chamber of the plasma enhanced chemical vapor deposition equipment for preparing the thin-film encapsulation layer 200, a pulse sequence of a radio frequency power is set to 10/100 milliseconds, and using tetrafluoroethane as reaction monomers, the hydrophobic thin film 300 having a uniform thickness is formed on a surface of the thin-film-encapsulated inorganic layer away from the organic light-emitting device 100.

The method of preparing the hydrophobic thin film 300 provided in the embodiments of the present invention improves disadvantages of the hydrophobic thin film 300 prepared by spray coating and other methods in the conventional art, such as uneven thickness, uneven brightness, and poor compactness of the display device 1, and etc. Thus, the hydrophobic thin film 300 having uniform thickness, excellent sealing performance, and good surface bonding performance is obtained. In addition, during deposition of the hydrophobic thin film 300, the equipment used in preparing the thin-film encapsulation layer 200 can be directly used without other equipment, simplifying manufacturing steps and saving equipment costs.

Fourth Embodiment

An embodiment of the present invention provides yet another method of manufacturing a display device 1, which is used to prepare the display device 1 as described in the first embodiment, and includes following steps.

Step 10, preparing a mask plate 400, wherein the mask plate 400 is usually made of a metal material. First, a plurality of second patterns 410 are formed on a metal plate by methods such as electroforming, cleaning, laser cutting, electroforming, and secondary cleaning, and the second patterns 410 are arranged on the metal plate in an array. Each the second pattern 410 is similar to the second pattern 410 of the mask plate 400 in the first embodiment, so it is not described in detail here. Then, after chemical etching and polishing, the mask plate 400 is fixed in a protection frame 420 by welding, fusion welding, and other processes. The protection frame 420 is a steel plate, which can be formed by cast, washed, laser cut, electroforming, secondary cleaning, lathe processing, and other methods. Finally, a layer of alumina is covered on a surface of the mask plate 400 to prevent the mask plate 400 from damaged by oxidative corrosion of water vapor, thereby completing the preparing of the mask plate 400.

Step 20, providing a base layer 10, wherein the base layer 10 includes an organic light-emitting device 100 and a thin-film encapsulation layer 200 covering the organic light-emitting device 100. The thin-film encapsulation layer 200 can be deposited and formed by a plasma enhanced chemical vapor-deposition equipment.

Step 30, depositing a hydrophobic thin film 300, placing the base layer 10 provided in the step 20 in a chamber of a plasma enhanced chemical vapor-deposition equipment for depositing the thin-film encapsulation layer 200. The mask plate 400 prepared in the step 10 is fixed above the base layer 10, and the mask plate 400 is one to two millimeters away from the base layer 10. The mask plate 400 is accurately aligned with the base layer 10, and alignment accuracy is less than or equal to 10 microns, so that each second pattern 410 on the mask plate 400 corresponds to a display device 1, respectively. The hydrophobic thin film 300 is then formed by a microwave plasma chemical vapor-deposition method.

The microwave plasma chemical vapor-deposition method specifically includes following steps. First, using trimethylmethoxysilane as precursor monomers, and using argon as an operation gas. Then, a gas pressure of reaction monomers and the operation gas is maintained at 35 Pa and 60 Pa, respectively, and the monomers are broken into plasma, which reacts in the chamber of the plasma enhanced chemical vapor-deposition equipment and is deposited on a surface of the thin-film-encapsulated inorganic layer away from the organic light-emitting device 100 to form the hydrophobic thin film 300 having a uniform thickness.

The method of preparing the hydrophobic thin film 300 provided in the embodiments of the present invention improves disadvantages of the hydrophobic thin film 300 prepared by spray coating and other methods in the conventional art, such as uneven thickness, uneven brightness, and poor compactness of the display device 1, and etc. Thus, the hydrophobic thin film 300 having uniform thickness, excellent sealing performance, and good surface bonding performance is obtained. In addition, during deposition of the hydrophobic thin film 300, the equipment used in preparing the thin-film encapsulation layer 200 can be directly used without other equipment, simplifying manufacturing steps and saving equipment costs.

Fifth Embodiment

An embodiment of the present invention provides yet another method of manufacturing a display device 1, which is used to prepare the display device 1 as described in the first embodiment, and includes following steps.

Step 10, preparing a mask plate 400, wherein the mask plate 400 is usually made of a metal material. First, a plurality of second patterns 410 are formed on a metal plate by methods such as electroforming, cleaning, laser cutting, electroforming, and secondary cleaning, and the second patterns 410 are arranged on the metal plate in an array. Each the second pattern 410 is similar to the second pattern 410 of the mask plate 400 in the first embodiment, so it is not described in detail here. Then, after chemical etching and polishing, the mask plate 400 is fixed in a protection frame 420 by welding, fusion welding, and other processes. The protection frame 420 is a steel plate, which can be formed by cast, washed, laser cut, electroforming, secondary cleaning, lathe processing, and other methods. Finally, a layer of alumina is covered on a surface of the mask plate 400 to prevent the mask plate 400 from damaged by oxidative corrosion of water vapor, thereby completing the preparing of the mask plate 400.

Step 20, providing a base layer 10, wherein the base layer 10 includes an organic light-emitting device 100 and a thin-film encapsulation layer 200 covering the organic light-emitting device 100. The thin-film encapsulation layer 200 can be deposited and formed by a plasma enhanced chemical vapor-deposition equipment.

Step 30, depositing a hydrophobic thin film 300, placing the base layer 10 provided in the step 20 in a chamber of a plasma enhanced chemical vapor-deposition equipment for depositing the thin-film encapsulation layer 200. The mask plate 400 prepared in the step 10 is fixed above the base layer 10, and the mask plate 400 is one to two millimeters away from the base layer 10. The mask plate 400 is accurately aligned with the base layer 10, and alignment accuracy is less than or equal to 10 microns, so that each second pattern 410 on the mask plate 400 corresponds to a display device 1, respectively. The hydrophobic thin film 300 is then formed by an atmospheric pressure plasma chemical vapor-deposition method.

The atmospheric pressure plasma chemical vapor-deposition method specifically includes following steps. First, using argon as an operation gas to bring out monomer hexamethyldisilazane in a foaming manner. Then, using a 13.56 MHz RF power source as an excitation source, which reacts in the chamber of the plasma enhanced chemical vapor-deposition equipment and is deposited on a surface of the thin-film-encapsulated inorganic layer away from the organic light-emitting device 100 to form the hydrophobic thin film 300 having a uniform thickness. In the present preparation method, at least one of helium gas and nitrogen gas can be used as an operation gas to generate plasma.

The method of preparing the hydrophobic thin film 300 provided in the embodiments of the present invention improves disadvantages of the hydrophobic thin film 300 prepared by spray coating and other methods in the conventional art, such as uneven thickness, uneven brightness, and poor compactness of the display device 1, and etc. Thus, the hydrophobic thin film 300 having uniform thickness, excellent sealing performance, and good surface bonding performance is obtained. In addition, during deposition of the hydrophobic thin film 300, the equipment used in preparing the thin-film encapsulation layer 200 can be directly used without other equipment, simplifying manufacturing steps and saving equipment costs.

Although the invention is described herein with reference to specific embodiments, it should be understood that these embodiments are merely examples of the principles and applications of the invention. It should therefore be understood that many modifications can be made to the exemplary embodiments and that other arrangements can be devised without departing from the spirit and scope of the invention as defined by the appended claims. It should be understood that different dependent claims and features described herein may be combined in a manner different from that described in the original claims. It can also be understood that features described in connection with separate embodiments may be used in other described embodiments.

What is claimed is:

1. A display device, comprising:
an organic light-emitting device;
a thin-film encapsulation layer covering the organic light-emitting device; and
a hydrophobic thin film covering the film encapsulation layer;
wherein the hydrophobic thin film comprises at least one first pattern;
the display device comprises at least two non-bending regions and a bending region connecting the at least two non-bending regions, a bending line defined on the bending region, and the bending region bending along the bending line, wherein the at least one first pattern comprises:
at least two hollow portions respectively defined on two sides of the bending region; and
a masking portion surrounding the at least two hollow portions;
wherein a portion of the masking portion between the at least two hollow portions corresponds to the bending line.

2. The display device according to claim 1, wherein the masking portion comprises a plurality of grooves, the grooves interlaced with each other and penetrate the hydrophobic thin film,
wherein each of the grooves comprises at least two groove walls with an included angle between the at least two groove walls, and the included angle is less than 180°; and wherein the display device comprises a bending radius R in the bending region, a penetration length of the grooves is L, and L satisfies a following formula: $L > \pi R$.

3. The display device according to claim 1, wherein at least one side of the masking portion away from the at least two hollow portions comprises a zigzag structure in the bending region.

4. A method of manufacturing the display device according to claim 1, comprising following steps:
   preparing a mask plate;
   providing a base layer, wherein the base layer comprises the organic light-emitting device and the thin-film encapsulation layer covering the organic light-emitting device; and
   forming the hydrophobic thin film on the thin-film encapsulation layer by using the mask plate and a deposition method, wherein the mask plate comprises a second pattern.

5. The method of manufacturing the display device according to claim 4, wherein the second pattern comprises:
   at least two first shielding portions corresponding to the at least two hollow portions of the hydrophobic thin film;
   a plurality of through-hole portions surrounding the at least two first shielding portions and corresponding to the masking portion of the hydrophobic thin film; and
   a second shielding portion surrounding the plurality of through-hole portions.

6. The method of manufacturing the display device according to claim 5, wherein the second pattern further comprises a plurality of third shielding portions connected to the at least two first shielding portions and the second shielding portion through the plurality of through-hole portions, and corresponding to grooves of the hydrophobic thin film.

7. The method of manufacturing the display device according to claim 6, wherein a plurality of shadow slopes of the mask plate are arranged at the second shielding portion and the plurality of third shielding portions, and are oriented toward the plurality of through-hole portions;
   wherein each of the plurality of shadow slopes is arranged on a same surface of the mask plate; and
   a cross-sectional width of the third shielding portions is D, a horizontal width of the shadow slopes is W,
   wherein D and W satisfy following formula: $D \leq 2*W$.

8. The method of manufacturing the display device according to claim 5, wherein the second pattern comprises at least two first regions and a second region connected to the at least two first regions, the at least two first regions correspond to a non-bending region of the hydrophobic thin film, the second region corresponds to a bending region of the hydrophobic thin film, and a side of the second shielding portion facing the plurality of through-hole portions comprises a zigzag structure in the second region.

9. The method of manufacturing the display device according to claim 4, wherein the deposition method is at least one of a plasma chemical vapor-deposition method, a low-pressure plasma chemical vapor-deposition method, a radio frequency pulsed low-pressure plasma chemical vapor-deposition method, a microwave plasma chemical vapor-deposition method, or an atmospheric pressure plasma chemical vapor-deposition method.

* * * * *